US009064713B2

United States Patent
Lenz

(10) Patent No.: US 9,064,713 B2
(45) Date of Patent: Jun. 23, 2015

(54) VOLTAGE REGULATOR USING N-TYPE SUBSTRATE

(75) Inventor: Michael Lenz, Zomeding (DE)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 352 days.

(21) Appl. No.: 13/604,653

(22) Filed: Sep. 6, 2012

(65) Prior Publication Data

US 2014/0062436 A1    Mar. 6, 2014

(51) Int. Cl.
| | |
|---|---|
| *H01L 27/06* | (2006.01) |
| *G05F 1/46* | (2006.01) |
| *G05F 1/613* | (2006.01) |
| *H01L 23/00* | (2006.01) |

(52) U.S. Cl.
CPC .............. *H01L 27/0623* (2013.01); *G05F 1/46* (2013.01); *G05F 1/613* (2013.01); *H01L 24/06* (2013.01); *H01L 24/49* (2013.01); *H01L 2224/0603* (2013.01); *H01L 2224/48091* (2013.01); *H01L 2224/48247* (2013.01); *H01L 2224/48257* (2013.01); *H01L 2224/4903* (2013.01); *H01L 2224/49113* (2013.01); *H01L 2924/13091* (2013.01); *H01L 2924/3025* (2013.01); *H01L 2924/1306* (2013.01); *H01L 2924/1305* (2013.01)

(58) Field of Classification Search
CPC .................................. G05F 1/46; G05F 1/613
See application file for complete search history.

(56) References Cited

U.S. PATENT DOCUMENTS

| 3,571,630 | A | * | 3/1971 | Widlar ........................ 327/580 |
| 3,629,623 | A | * | 12/1971 | Sakurai et al. ............... 327/565 |
| 5,548,205 | A | * | 8/1996 | Monticelli .................... 323/274 |
| 7,504,877 | B1 | * | 3/2009 | Voogel et al. ................. 327/536 |
| 7,795,856 | B2 | | 9/2010 | Aota |
| 8,633,098 | B2 | | 1/2014 | Han et al. |
| 8,823,342 | B2 | * | 9/2014 | Williams ...................... 323/268 |
| 2008/0297132 | A1 | | 12/2008 | Aota |
| 2010/0002473 | A1 | * | 1/2010 | Williams .................. 363/21.06 |
| 2012/0021596 | A1 | | 1/2012 | Han et al. |

FOREIGN PATENT DOCUMENTS

| CN | 101106107 A | 1/2008 |
| CN | 101315568 A | 12/2008 |
| CN | 102222616 A | 10/2011 |
| CN | 102299156 A | 12/2011 |

OTHER PUBLICATIONS

L78MxxAB, L78MxxAC, Precision 500 mA regulators, Doc ID 2147 Rev 9, Jul. 2009, 29 pages.
LM1084 5A Low Dropout Positive Regulators, Aug. 2002, National Semiconductor Corporation, 13 pages.
LP38841-ADJ 0,8A Ultra Low Dropout Adjustable Linear Regulators Stable with Ceramic Output Capacitors, Dec. 2006, National Semiconductor Corporation, 10 pages.

* cited by examiner

Primary Examiner — Evan Pert

(57) ABSTRACT

In various embodiments a voltage regulating circuit is provided which may include a control transistor at least partially formed in an n-type substrate, and a regulating circuit including a regulating output coupled to a control region of the control transistor, wherein the regulating circuit includes at least one transistor which is formed at least one of on and in the n-type substrate.

19 Claims, 10 Drawing Sheets

US 9,064,713 B2

VOLTAGE REGULATOR USING N-TYPE SUBSTRATE

TECHNICAL FIELD

Various embodiments relate to a voltage regulator.

BACKGROUND

Conventional integrated analog voltage regulators are manufactured using technologies based on p-type substrates. The contacts of electronic devices provided on a p-type substrate are arranged on a front side of the substrate, the back side of the substrate is usually used for convenient mounting/attaching. However, those so-called IC (integrated circuit) technologies may have a disadvantage in the field of power electronics. In pass elements, i.e. controlled variable resistance devices such as a power transistor, based on a p-substrate technology a current flow takes place in a lateral direction of the device, i.e. in a direction parallel to a surface of the p-type substrate. In addition, the provision of the contacts of other electronic devices of, for example, a voltage regulator on the front side surface of the wafer necessitates wire bonds which establish electrical connections between contact pads on the chip or integrated circuit (IC) and corresponding contacts of a surrounding circuitry on a printed circuit board. Wire bonds, being rather fragile structures prone to breaking easily, may lead to increased costs and contribute to an overall increased electrical resistance.

SUMMARY

In various embodiments a voltage regulating circuit is provided which may include a control transistor at least partially formed in an n-type substrate, and a regulating circuit including a regulating output coupled to a control region of the control transistor, wherein the regulating circuit includes at least one transistor which is formed at least one of on and in the n-type substrate.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

Figure 1:
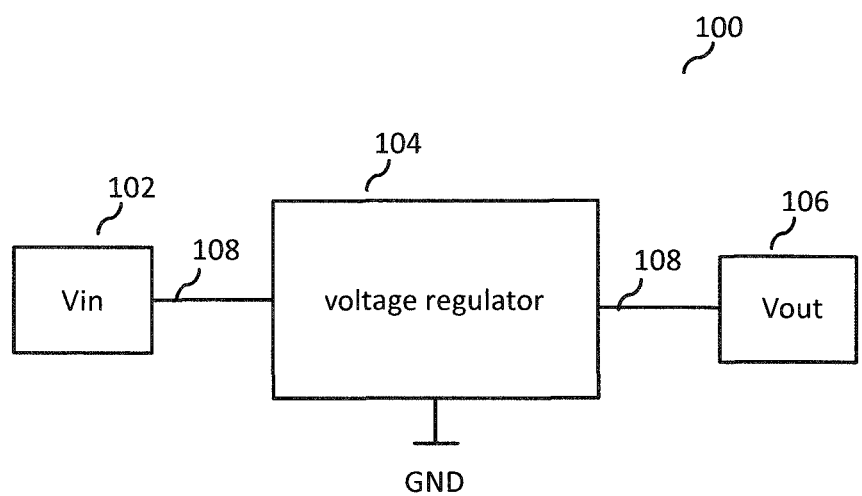
FIG. 1 shows a common voltage regulating application.
Figure 2:
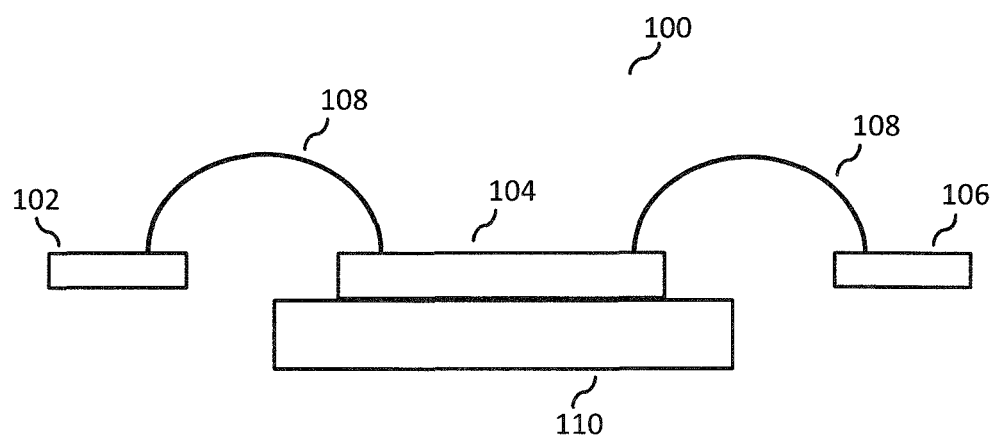
FIG. 2 shows a side view of the common voltage regulating application shown in FIG. 1.

In FIG. 1 a schematic block diagram of a common voltage regulating application 100 is shown. In FIG. 2 the voltage regulating application of FIG. 1 is shown in a side view. The voltage regulating application 100 includes a voltage regulator 104 which may be provided as an IC, for example. The voltage regulating application 100 includes an input terminal 102 to which an input voltage Vin to be regulated/controlled may be applied. The input terminal 102 may be a pad and may be provided on a printed circuit board (PCB), for example. The voltage regulating application 100 may further include an output terminal 106 which may be a pad at which a regulated/controlled output voltage Vout may be provided. The input terminal 102 and the output terminal 106 are connected to the voltage regulator 104 by the means of wire bonds 108. The voltage regulator 104 is connected to a PCB (not explicitly shown in FIG. 1 and FIG. 2) via a lead frame 110.

Figure 3:
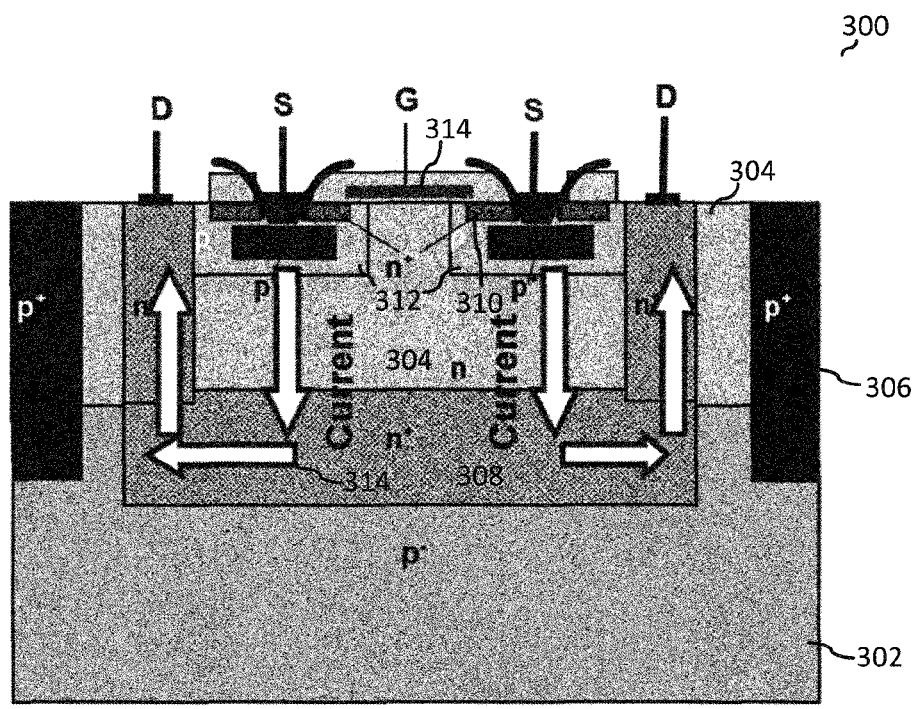
FIG. 3 shows an ordinary NMOS transistor.

In FIG. 3 an ordinary NMOS (n-channel metal-oxide-semiconductor) transistor is shown. The NMOS transistor 300 may be provided within the voltage regulator 104 shown in FIG. 1 and FIG. 2, being used as a pass element with its drain contact D coupled to the input terminal 102 and its source contact S coupled to the output terminal 106, for example. The NMOS transistor 300 is provided on a p-type substrate 302 on top of which an n-type epitaxial layer 304 is provided. The substrate 302 may be connected to the ground potential. A U-shaped n-type well 308 is provided in the epitaxial layer 304 and the substrate 302, wherein portions of the n-type well 308 being in contact with the upper surface of the epitaxial layer 304 are coupled to the drain electrodes D. The well 308 may be n-doped with a doping concentration which is larger than the doping concentration of the n-doped epitaxial layer 304. A gate contact G is coupled to a gate region 314 which is surrounded by a gate dielectric and arranged on the upper surface of the epitaxial layer 304 in the middle above the U-shaped well 308. A source contact S is coupled to a source region 310 which is embedded in a p-type well region 312. The NMOS transistor 300 is laterally separated from other devices via p-type isolation trenches 306 extending from the upper surface of the epitaxial layer 304 into the substrate 302. The arrows 314 in FIG. 3 symbolically indicate the direction of the current flow through the NMOS transistor 300 when it is in conducting state. The input voltage Vin is applied to the voltage regulator 104 from the input terminal 102 via the bond wire 108. The regulated voltage Vout output by the voltage regulator 104 is provided at the output terminal 106 which is coupled to the voltage regulator via another bond wire 108. The regulated output voltage Vout may then be applied to a load. The arrows 314 indicate the current flow through the NMOS transistor 300 during the operation of the voltage regulating application 100. The current is supplied via the source contact(s) S to the source region(s) 310. With an appropriate potential applied to the gate region 314 an n-type channel is formed underneath the gate region 314 in the p-type well regions 312 such that the current can pass from the source region(s) 310 into the epitaxial layer 304 which in this case may be seen to be the body of the NMOS transistor 300. The current then sinks deep into the epitaxial layer 304 until it reaches the n-type well 308 and continues flowing in a horizontal/lateral direction until it reaches a vertically extending part of the n-type well 308 connecting the drain contact D with the lower horizontal part of the n-type well 308.

The NMOS transistor 300 shown in FIG. 3 is only one exemplary switching device provided on a p-type substrate. In a similar manner, PMOS transistors and NPN/PNP bipolar transistors may be manufactured on n-type substrates as well.

In case a high current is to be provided at the output terminal 106 of the voltage regulating application 100 several problems may occur. On the one hand, expensive wire bonds have to be provided as connecting elements between connection terminals provided on the chip/IC and the corresponding connection pads provided on the leadframe. The material used for the wire bonds should have a very low resistivity such that current may flow in and out of the chip/IC with as little losses as possible. Therefore, aluminium, copper or gold is mostly used as the material for wire bonds. In high current voltage regulating applications the pass element is very often subdivided into several transistors, for example into four single transistors. Two transistors may share an input terminal and an output terminal such that in total two input terminal pads and two output terminal pads may be provided on the chip/IC having a four transistor pass element which need to wire boned to corresponding contacting pads on the leadframe.

Figure 4:
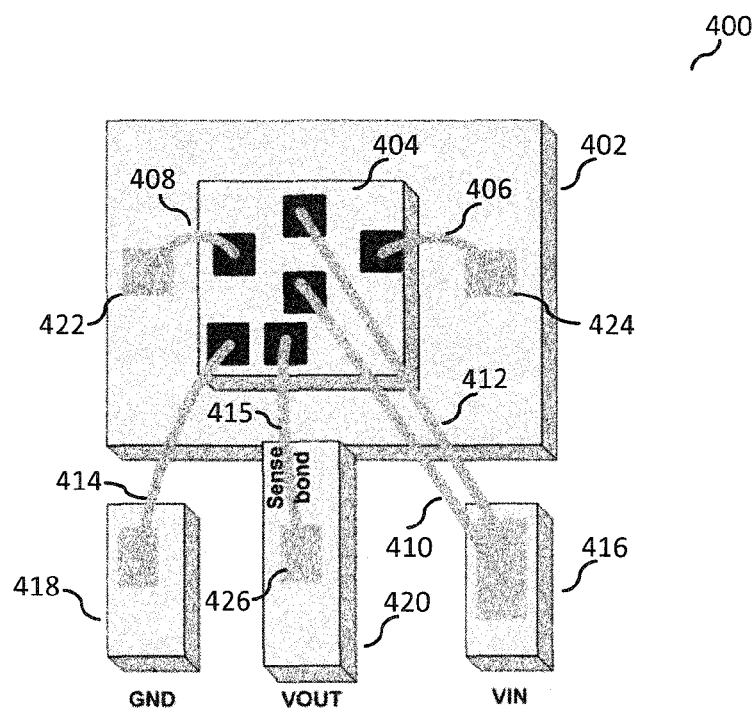
FIG. 4 shows an internal setup of a common voltage regulating application.

The aspect just described is depicted in FIG. 4 which shows an internal setup of a common voltage regulating application 400. The voltage regulating application setup 400 includes a voltage regulator 404 which may be provided as a chip/IC attached to a lead frame 402. A first wire bond 408 is provided to electrically couple an external first connection pad 422 provided on the lead frame 402 to a corresponding first output connection pad provided on the voltage regulator 404, a second wire bond 406 is provided to electrically couple an external second connection pad 424 provided on the leadframe 402 to a corresponding second output connection pad provided on the voltage regulator 404. The term "external" with respect to connection pads denotes connection pads which are not provided on the voltage regulator 404 but which form connection/bonding pads provided on the leadframe or on other related connecting elements for establishing electrical contact between the chip/IC and a PCB. The external first connection pad 422 and the external second connection pad 424 are electrically connected to an output terminal 420 at which the regulated output voltage Vout is provided. A third wire bond 410 is provided to electrically couple a first input connection pad provided on the voltage regulator 404 with a input terminal 416 to which an input voltage Vin to be regulated may be applied. A fourth wire bond 412 is provided to electrically couple a second input connection pad provided on the voltage regulator 404 with the input terminal 416. In other words, due to the subdividing of the pass element of the voltage regulator 404 into four transistors (not explicitly shown in FIG. 4) two input wire bonds (first wire bond 408 and second wire bond 406) and two output wire bonds (third wire bond 410 and fourth wire bond 412) need to be provided. In addition, a fifth wire bond 414 is provided in order to electrically couple a ground terminal 418 to a ground connection pad provided on the voltage regulator 404. Furthermore, a sixth wire bond 415 is provided in order to electrically connect a sense connection pad provided on the voltage regulator 404 with an external sense pad 426 electrically coupled to the output terminal 420. The voltage regulator 404 may require the sixth wire bond 415 in combination with the external sense pad 426 in order to sense the actual output voltage Vout and compare it to a reference output voltage. Otherwise, if the output voltage would be sensed at the first and/or second output connection pads (i.e. in the "sphere" or the chip/IC), the voltage drop due to the resistance of the first wire bond 408 and/or second wire bond 406 may not be accounted for such that the output voltage Vout output at the output terminal 420 may be offset from the desired output voltage value. By sensing the output voltage Vout via the external sense pad 422, the voltage regulator 404 may use the actual output voltage Vout output at the output terminal 420. Therefore, the possible voltage drops incurred by the first wire bond 408 and/or the second wire bond 406 may be accounted for by the voltage regulator 404. In summary, a voltage regulating application setup 400 based on an ordinary pass element provided on a p-type substrate may require at least six wire bonds.

Voltage regulating applications which are based on p-type substrate technologies and which are configured to provide high output currents may further suffer from a too high drop voltage at the pass element, that is at the at least one transistor which is driven by a regulating circuit to provide a desired regulated output voltage Vout. The drop voltage is the key parameter of so-called post voltage regulators. Post voltage regulators, coupled downstream of DC-DC converters, are used to reduce the output voltage of a corresponding DC-DC converter to appropriate voltages required by applications powered by the DC-DC converter, for example from 5 V to 3.3 V, 2.5 V, 1.8V or 0.9V, and to correct/readjust an output voltage from a corresponding DC-DC converter to more exact values.

Various high current voltage regulating applications include pass elements in the form of a Darlington pair which are used in fast voltage regulators, especially when the drop voltage plays a secondary role. In those voltage regulators designed for fast regulating speeds only small output capacitors are required with capacitances of less than 1 µF.

If, on the contrary, a low drop voltage is of crucial importance, usually pnp bipolar transistors or PMOS (p-channel metal-oxide-semiconductor) transistors are used. However, since voltage regulators based on those transistors have a low current-carrying capacity and result in slow voltage regulators, larger output capacitors with capacitances in the range of 10 µF or may need to be provided such that, in effect, a larger chip area may be required. At higher currents so-called quasi-PNPs (a combination of a PNP bipolar transistor-based driver/regulating circuit and an NPN bipolar transistor-based pass element) are used. Those configurations have the disadvantages of a higher drop voltage coupled with still quite large output capacitors with capacitances in the range of 10 µF or more.

With ordinary voltage regulators which are available on the market nowadays there is always a trade-off between a low drop voltage and fast operating speed. Voltage regulators which are part of monolithically integrated system ICs are not affected by those issues, since the pass element is usually comprised of several transistors, for example ten transistors or more, and therefore the current passing through a single transistor is not as high as in common voltage regulating applications such as the one shown in FIG. 4, where each transistor may carry a rather high current, for example a current in the range of 0.5 A or more. Such voltage regulators often use DMOS (double-diffused MOS) transistors as pass elements which, however, are based on p-type substrate technologies with the disadvantages described above.

According to various embodiments, a voltage regulating circuit with improved voltage characteristics may be provided which is manufactured using n-type substrates in combination with p-type wells, wherein each p-type well may be individually coupled/wired to a desired potential, for example to a ground potential. By combining those two aspects all the problems of the related art may be addressed at the same time and the following advantages may be obtained. In accordance with various embodiments, the voltage regulating circuit may have a low drop voltage and a fast settling time (fast regulating speed) such that only small output capacitors may be required. The voltage regulating circuit according to various embodiments may further offer a reasonably priced and simple standard assembly. Furthermore, the voltage regulating circuit according to various embodiments may combine low chip costs with a very high robustness with respect to the maximally rated input voltage, short-circuit conditions, ESD (electrostatic discharge) conditions and incoupling of HF disturbances (HF: high frequency). As a yet further effect the voltage regulating circuit according to various embodiments may be able to carry high peak currents and it may be provided with a soft start functionality. The soft start functionality may refer to the ability of the voltage regulating circuit according to various embodiments to feature initial powering on phases with very little transient overshoot.

Figure 5:
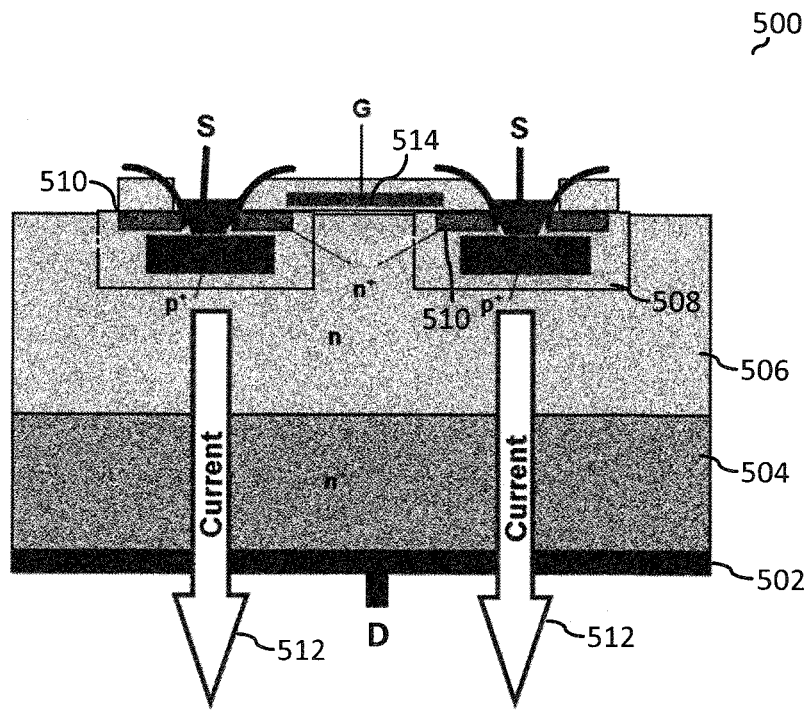
FIG. 5 shows a MOS transistor based on an n-substrate technology according to various embodiments.

In FIG. 5 a MOS transistor 500 based on an n-substrate technology is shown. The MOS transistor 500 may be used as a (power) pass element in a voltage regulating circuit according to various embodiments and may, for example, be configured as a DMOS transistor. The MOS transistor 500 shown in FIG. 5 is configured as a vertical MOS transistor, meaning that the current flow in the transistor 500 takes place in a substantially vertical direction or a perpendicular direction with respect to a plane defined by the substrate/wafer. In other words, the vertical MOS transistor 500 may be configured such that in conducting state, a current flows from an upper surface (top surface) of the substrate through the substrate/wafer to a lower surface (bottom surface) of the substrate/wafer. However, the voltage regulating circuit according to various embodiments may just as well include a (power) pass element different from the implementation of the vertical MOS transistor 500 shown in FIG. 5 which may be configured to permit a current flow between an input terminal provided on one side of the substrate and an output terminal provided on the other side of the substrate located opposite the one side of the substrate.

The vertical MOS transistor shown in FIG. 5 in a cross-sectional side view is formed in a two layered structure including a substrate 504 and an epitaxial layer 506. The substrate 504 may be an n-type substrate (n+ substrate) with a doping concentration of approximately $10^{17}$ cm$^{-3}$ or more, for example. The epitaxial layer 504 may be an n-doped layer (n epitaxial layer) with a doping concentration in the range between approximately $10^{16}$ cm$^{-3}$ and approximately $5 \cdot 10^{16}$ cm$^{-3}$, for example. Each of the source contacts S (or source electrodes), that is the left source contact and the right source contact which may form two parts of a single source contact/electrode, may be coupled to source regions 510 which may be n-doped (n+ source regions). The source regions 510 may be formed in a p-doped well region 508 (p well region). In the part of the p-doped well region 508 located adjacent to a corresponding source region 510 and underneath the gate electrode 514 a conducting channel is formed when an appropriate potential is applied to the gate contact G. The arrows 512 indicate the direction of the current flow through the vertical DMOS transistor 500 shown in FIG. 5 when it is in conducting state. After having passed from the source regions 510 and the channel formed underneath the gate electrode 514 into the portion of the epitaxial layer 506 located between the p-doped well regions 508, the current flows vertically towards a back side (lower side) of the substrate 504 to the drain contact D of the vertical MOS transistor 500. The drain contact D may be provided as a metallized layer 502 on the back side of the substrate 504. In other words, the drain contact D and the source contacts S are provided on different sides of the substrate 504, wherein the drain contact D may be provided on the back side of the substrate 504 and the source contact S may be provided above the upper surface of the substrate 504 (at an upper surface of the epitaxial layer 506 provided on the substrate 504). In comparison to the NMOS transistor 300 shown in FIG. 3 the current flow through the vertical MOS transistor 500 according to various embodiments is substantially directed perpendicularly to a plane defined by the substrate 504 and the input terminal, for example the drain contact D, and the output terminal, for example the source contact, of the vertical MOS transistor 500 are provided on different sides of the substrate 504. In other words, the current flows vertically through the MOS transistor 500.

Figure 6:
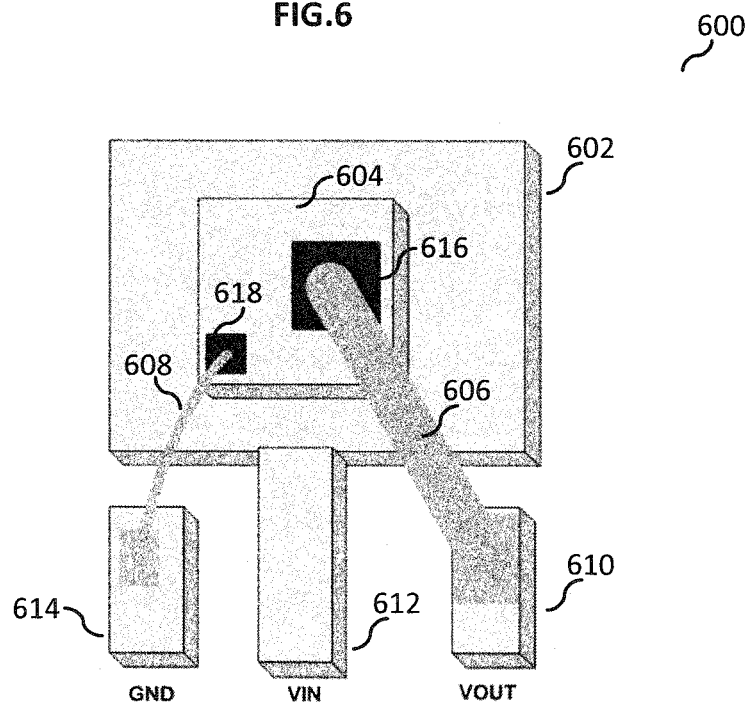
FIG. 6 shows an internal setup of a the voltage regulating application according to various embodiments.

The impact of using a pass element as the one depicted in FIG. 5 on a voltage regulating circuit according to various embodiments is shown in FIG. 6.

FIG. 6 shows an internal setup of a voltage regulating application 600 according to various embodiments. In analogy to the ordinary voltage regulating application 400 shown in FIG. 4, the voltage regulating application 600 according to various embodiments includes a voltage regulator 604 which may be provided as a microchip/IC and which may be arranged on a lead frame 602. A first bond wire 606 may be provided to electrically couple an external output terminal 610 to an output terminal pad 616 provided on the voltage regulator 604. The first bond wire 606 may, for example, include gold, copper or/and aluminium or a mixture of any of those materials and have a thickness of approximately 500 μm. However, the first bond wire 606 may be also provided in the form of a multitude of separate wire bonds, for example a multitude of three separate wire bonds including gold, copper or/and aluminium or a mixture of any of those materials, each bond wire having a thickness of approximately 75 μm. A second wire bond 608 is provided in order to electrically couple an external ground terminal 614 to a ground connection pad 618 provided on the voltage regulator 604. The second wire bond 608 may, for example, include gold, copper or/and aluminium or a mixture of any of those materials, and have a thickness of approximately 75 μm. The external input terminal 612 may be coupled to the input terminal of the pass element which is provided in the voltage regulator 604, for example to the drain contact D of the vertical MOS transistor 500 (not explicitly shown in FIG. 6) without using wire bonds as the back side of the substrate 504 may be brought in direct contact with the leadframe 602. Therefore, a robust interconnect with a negligible resistance may be established between the input terminal of the pass element of the voltage regulator 604, for example the vertical MOS transistor 500, and the external input terminal 612 through the back side of the substrate on which the pass element is arranged.

In comparison to the voltage regulating application 400 shown in FIG. 4 it can be seen that four out of six bond wires may be omitted in the voltage regulating application 600 according to various embodiments shown in FIG. 6. Due to the vertical current flow through the pass element, as described above with reference to FIG. 5, the back side of the substrate may be or may include the drain contact and it may be directly connected to the leadframe without the necessity of using wire bonds. In addition, as there are no wire bonds connecting the external input terminal 612 with the voltage regulator 604, the sixth wire bond 415 shown in FIG. 4 fulfilling the role of a sense wire bond may be omitted as the voltage drop between the input terminal of the pass element of the voltage regulator 604 and the external input terminal 612 connected thereto may be negligible. In other words, only one high power bond, i.e. the first wire bond 606, may be needed to electrically couple an output terminal of the voltage regulator 604, for example the source contact S of the vertical MOS transistor 500, with the external output terminal 610. In addition, due to the larger contact surface between the leadframe and the input terminal, for example the drain contact D of the vertical MOS transistor 500, that contact surface may be used to transfer heat from the voltage regulator microchip 404 to the leadframe, a process which may be used for cooling of the voltage regulator chip 404. Furthermore, the thickness of the chip, i.e. the overall thickness of the structure including the substrate 504 and the epitaxial layer 506 may be reduced. The underlying technology may be used for the manufacture of high power high side switches where the thermal resistance $R_{th}$ is a crucial parameter. By keeping the chip relatively thin, e.g. the thickness thereof being in the range of 100 μm and less, the thermal resistance may be reduced and therefore the power switch may be cooled more efficiently.

It is to be noted that the terms "output terminal" and "input terminal" are non-restricting features and therefore may be interchanged without parting from the concept of the voltage regulating circuit according to various embodiments. That is, instead of the input terminal of the pass element, for example the drain contact D of the vertical MOS transistor 500, being provided on the back side of the substrate the output terminal of the pass element, for example the source contact S of the vertical MOS transistor 500, may be provided on the back side of the substrate. In other words, the association of a drain and a source of a transistor as a pass element with an input and an output of the voltage regulator 604 is purely arbitrary.

The first wire bond 606 may be manufactured using standard processes which are used in the manufacture of ordinary MOSFETs (MOS field effect transistors), for example wire bonding using thick aluminium wire bonds. The usage of a vertical MOS transistor as the pass element, that is as the variable resistance device through which the current flows to the load, may make it possible to provide a fast voltage regulator which may only require small output capacitors and which has a very low drop voltage due to a small on-state resistance ($R_{DSON}$), i.e. the resistance between the input terminal and the output terminal of the pass element in its conducting state, for example the resistance between the source contact S and the drain contact D of the vertical MOS transistor 500 shown in FIG. 5. Furthermore, high peak currents may be achieved with a voltage regulator according to various embodiments deploying a pass element, such as a transistor, based on an n-type substrate and a soft start functionality may be easily implemented.

Figure 7A:
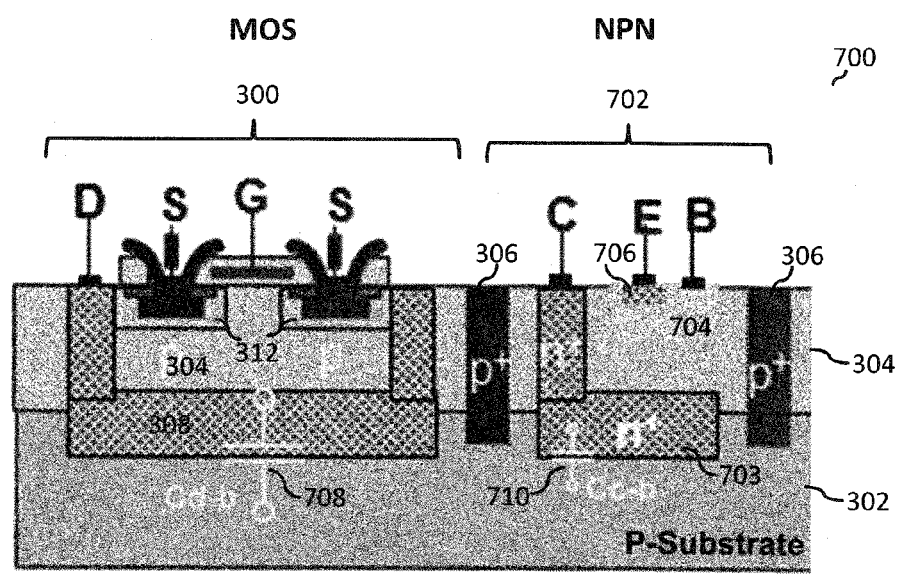
FIG. 7A shows a portion of an ordinary voltage regulating circuit including a pass element and a further transistor.

In the following a further possible effect of the voltage regulating circuit according to various embodiments based on a n-type substrate over an ordinary voltage regulating circuit based on a p-type substrate will be explained with reference to FIG. 7A and FIG. 7B. It is assumed that a voltage regulating circuit includes at least a pass element, for example a transistor, and a regulating/controlling circuit driving the pass element such that a regulated output voltage of a desired magnitude may be provided at the output terminal of the pass element. In FIG. 7A a portion of an ordinary voltage regulating circuit is shown including a pass element, for example the MOS transistor 300 shown in FIG. 3, and a further transistor 702 which may belong to the regulating/controlling circuit. Both transistors are provided on a p-type substrate as known in the related art. The MOS transistor 300 will not be described again as it corresponds to transistor 300 shown in FIG. 3. Elements of FIG. 3 which are also present in FIG. 7A will be labelled with the same reference numbers and they will not be described again.

The further transistor 702 chosen for the representation of a transistor belonging to the regulating circuit within a voltage regulating circuit is in this case a NPN bipolar transistor. The further transistor 702 is separated from the pass element 300 by the means of the p-type trench region 306 extending from the upper surface of the epitaxial layer 304 into the substrate 302. The further transistor 702 includes a collector electrode C coupled to a collector region 703 which is n-doped, an emitter electrode E which is coupled to an n-doped emitter region 706 and a base electrode B which is coupled to a base region 704, wherein the emitter region 706 is surrounded by the base region 704.

In the ordinary voltage regulating circuit based on the p-type substrate technology, as shown in FIG. 7A, disturbances (i.e. undesired electromagnetic fields), for example HF disturbances, may be coupled via the drain contact D into the drain region 308 of the MOS transistor 300. From the drain region 308 which has a rather large surface, the HF disturbances may be coupled into the highly resistive substrate 302 via a drain-to-substrate (for drain-to-bulk) capacitor 708 (Cd-b) which has a relatively large capacitance due to the large area of the contact surface between the drain region 308 and the substrate 302. The lower surface (backside) of the substrate 302 may be coupled to a reference potential, e.g. the ground potential, but due to the rather substantial thickness of the substrate 302 which may lie in the range of approximately 200 μm to approximately 500 μm, for example, the substrate 302 located directly underneath the MOS transistor 300 cannot be effectively grounded (while keeping in mind that the structure embodying the actual MOS transistor 302 may have a thickness in the range of approximately 10 μm to approximately 20 μm). Thus, the disturbances injected from the drain region 308 into the substrate 302 may spread through the substrate 302 and affect neighbouring devices such as the further transistor 702. The disturbances may, for example, affect the operating point of the further transistor 702 via lateral substrate resistors and/or a collector-to-substrate (or collector-to-bulk) capacitor 710 (Cc-b) which may have a relatively large capacitance due to a low potential difference between the collector region 703 and the substrate 302. In other words, the p-substrate 302 may function as a "pumping" substrate which spreads HF disturbances from one transistor to another transistor, the coupling between the substrate 302 and the drain region 308 or the collector region 703 of the respective transistor taking place via the rather large substrate-to-drain capacitance and substrate-to-source capacitance, respectively.

Figure 7B:
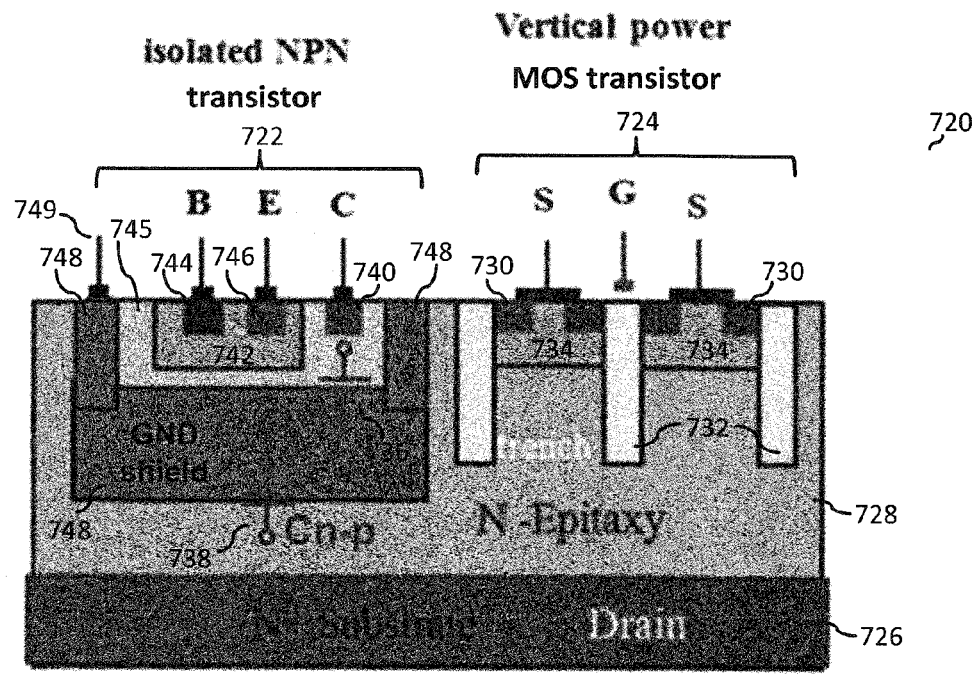
FIG. 7B shows a portion of a voltage regulating circuit according to various embodiments including a pass element and a further transistor.

In FIG. 7B, a section of a voltage regulating circuit 720 according to various embodiments is shown. The section of the voltage regulating circuit 700 according to various embodiments may include a pass element 724 such as a vertical power trench MOS transistor and a further transistor 722 which may, for example, belong to a bandgap reference voltage circuit or an error amplifier provided in the voltage regulating circuit according to various embodiments.

The two exemplarily shown transistors in FIG. 7B are provided on an n-type substrate 726. The n-type substrate 726 may have a doping concentration of approximately $10^{17}$ cm$^{-3}$ or more, for example. An n-type epitaxial layer 728 may be provided on the substrate 728 with a doping concentration in the range between approximately $10^{16}$ cm$^{-3}$ and approximately $5 \cdot 10^{16}$ cm$^{-3}$, for example. On the right side of FIG. 7B a vertical power trench MOS transistor 724 is shown. On the surface of the epitaxial layer 728 a gate contact G and two source contacts S are provided. The gate contact G is coupled to a gate region which extends downwards into the epitaxial layer 728 in a trench 732. The gate region (not explicitly marked in FIG. 7A) within the trench 732 is surrounded by an isolating layer, for example a dielectric material. Each source contact S is coupled to a source region 730. Underneath each source contact S and between two portions of a source region 730 a body region 734 is provided. The body region may be p-doped and it may have a doping concentration of approximately $10^{17}$ cm$^{-3}$. In the exemplary vertical power trench MOS transistor 724 are two source contacts S may be provided, wherein each source contact may be coupled to corresponding source regions 730 provided in the body region 734. Each of the two body regions 734 is surrounded by two trenches 732. With an appropriate potential applied to the gate contact G a current flow from the source regions 730 through a conducting channel formed in the body region 734 downwards through the epitaxial layer 728 to the drain region is established. In this exemplary embodiment of the pass element, the drain region may correspond to the n-type substrate 726. In analogy to the source contact S coupled to the source regions 730, a drain contact (not explicitly shown in FIG. 7B) may be connected to the drain region 726.

On the left side of FIG. 7B, adjacent to the vertical power trench MOS transistor 724, a further transistor 722 is provided. The further transistor may be configured as an isolated NPN bipolar transistor. The further transistor 722 may have a base region 742 in which an emitter region 746 coupled to an emitter contact D and a base contact region 744 (p+ doped) coupled to a base contact B are provided. The base region 742 may be surrounded by an epitaxial layer region 745 and it may be p-doped. The epitaxial layer region 745 may further include a collector contact region 740 (n+ doped) which is coupled to a collector contact C. The epitaxial region layer region 745 may be of the same kind as the epitaxial layer 728 and it may be surrounded by or be located within a well 748. In other words, the epitaxial layer region 745 may lie within the well 748 such that it is not in direct contact with the epitaxial layer 728 in which the well 748 is provided. The well 748 may be p-doped with a doping concentration in the range between approximately $1 \cdot 10^{16}$ cm$^{-3}$ and approximately $8 \cdot 10^{16}$ cm$^{-3}$. The well 748 may have a contacting electrode 749 coupled thereto which is provided on the upper surface of the epitaxial layer 728, that is on the same surface as the base contact B, the emitter contact E and the collector contact C of the further transistor 722.

The transistors shown in FIG. 7B which may form a section of the voltage regulating circuit according to various embodiments based on the n-type substrate technology show a different behaviour with respect to handling disturbances. Disturbances, for example HF-disturbances, may spread from the drain region of the vertical trench MOS transistor, which in this example corresponds to the n-type substrate 726, into the epitaxial layer 728 which has a relatively high ohmic resistance. The well 748 may be coupled to a reference potential, for example the ground potential, and therefore act as an isolation well isolating the "core" of the isolated NPN transistor 722 from the substrate 726 and/or the epitaxial layer 728. In other words, with such a configuration, the well 748 may be seen as a grounded shield. The spreading of disturbances may from the epitaxial layer 728 into the well 748 may take place through a first coupling capacitor 738 (also labelled with Cn-p). The first coupling capacitor 738 is symbolically indicated by a capacitor symbol representing a parasitic capacitor that is inherently formed between the n-doped epitaxial layer 728 and the p-doped well 748. Due to a relatively high voltage present at the first coupling capacitor 738 and the doping concentration of the epitaxial layer 728 and the doping concentration of the well 748 being rather small in combination with the area of the further transistor 722 being also small, the capacitance of the first coupling capacitor 738 is relatively small. Therefore, the first coupling capacitance 738 does not provide a good coupling path for disturbances between the epitaxial layer 728 and the well 748.

The well 748 may be coupled to the epitaxial layer region 745 (in which the isolated NPN bipolar transistor 722 is formed) by a second coupling capacitor 736 (Cp-c). The second coupling capacitor 736 is symbolically indicated by a capacitor symbol representing the parasitic capacitor that is inherently formed between the p-doped well 748 and the epitaxial layer region 745. By connecting the contacting electrode 749 of the well 748 to a reference potential, for example the ground potential, the "middle point" in the series arrangement of the first coupling capacitor 738 and the second coupling capacitor 736 may be effectively grounded. This may have the effect that the epitaxial layer region 745 provided within the well 748 may be effectively decoupled or shielded from the epitaxial layer 728 such that the isolated further transistor 722 may remain unaffected by disturbances (i.e. undesired electromagnetic fields) which to a very small extent may spread from the drain region into the epitaxial layer 728.

Figure 8A:
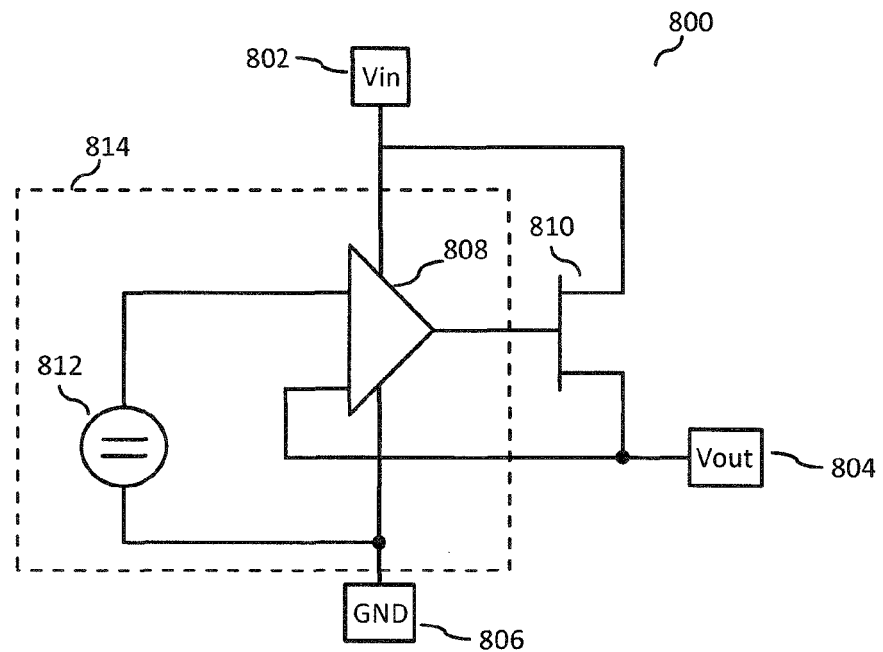
FIG. 8A and FIG. 8B show exemplary implementations of the voltage regulating circuit according to various embodiments.
Figure 8B:
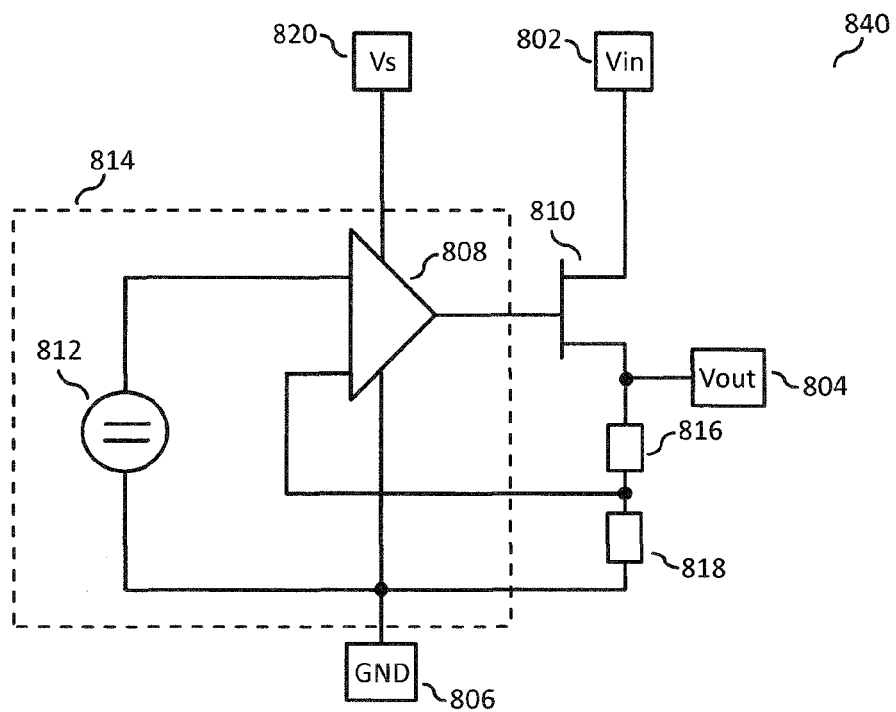

In FIG. 8A and FIG. 8B exemplary embodiments of a voltage regulating circuit are shown. In FIG. 8A a three pin embodiment is shown, in FIG. 8B a four pin embodiment is shown. The term pin may refer to a contact leg which may be directed outwards from a device package in which the voltage regulating circuit according to various embodiments may be packaged, for example as an IC, and which may be used to establish an electrical connection between the voltage regulating circuit and a PCB.

The voltage regulating circuit 800 according to various embodiments shown in FIG. 8A may include a pass element 810, for example a control transistor, and an error amplifier 808 coupled to a control terminal of the control transistor 810. The control transistor 810 may be coupled between an input terminal 802 and an output terminal 804. An input voltage Vin may be applied to the input terminal 802. A regulated output voltage Vout may be provided at the output terminal 804. A first power supply terminal of the error amplifier 808 may be coupled to the input terminal 802, a second power supply terminal thereof may be coupled to a reference potential terminal 806 to which a reference potential may be externally applied, for example the ground potential. A first input terminal of the error amplifier 808 may be coupled to one terminal of a reference voltage generator 812 which may be configured as a bandgap voltage reference source. According to various embodiments, a bandgap voltage source may be a circuit configured to provide a temperature independent reference voltage which may be based on a bandgap of a respective material, for example the bandgap of silicon. A further terminal of the reference voltage generator 812 may be coupled to the reference potential terminal 806. A second input terminal of the error amplifier 808 may be coupled to the output terminal 804. The error amplifier 808 and the reference voltage generator 812 may form a regulating circuit 814 with feedback control. The feedback signal used for feedback control may correspond to the output voltage Vout (or a signal derived therefrom, for example by the means of a divider). In order to perform feedback control, the regulating circuit 814 may be configured to provide a driving/control signal to the control terminal of the control transistor 810. In accordance with various embodiments feedback control may refer to a control scheme in which the feedback signal, for example the output voltage Vout, influences the regulating/control signal provided to the control region of the (power) pass element by the regulating circuit 814.

The portion of the voltage regulating circuit 720 according to various embodiments including a pass element 724, for example a vertical MOS transistor, and a further transistor 722 may correspond to a portion of the voltage regulating circuit 800 shown in FIG. 8. That is, the pass element 724 may correspond to the control transistor 810 and the further transistor 722 may correspond to any one of the transistors included in the regulating circuit 814. In order to provide feedback control, a sampling path through the substrate 728 and the epitaxial layer 728 may be provided, for example as a via, such that the output voltage Vout may be sampled at the backside of the substrate 726 (which is simultaneously the drain contact the vertical MOS transistor 724) as a feedback signal and may be processed at the opposite side of the substrate 726 by the regulating circuit 817, represented by the further transistor 722 in FIG. 7B.

During the operation of the voltage regulating circuit 800 according to various embodiments the output voltage Vout may be sensed and provided to the second input of the error amplifier 808 as a feedback signal. The error amplifier 808 may be configured to compare the sensed output voltage Vout with a reference voltage provided to its first input by the reference voltage generator 812. The error amplifier 808 may generate the driving/control signal on the basis of the comparison in order to adjust the resistance of the control transistor 808 such that the output voltage Vout is moved towards and/or is kept at the desired value which is defined by the value of reference voltage provided by the reference voltage generator 812. In other words, the error amplifier 808 may be any circuit which is configured to compare two signals and output a result signal indicating the difference between the two compared signals. For example, the error amplifier 808 may be a comparator or an operational transconductance amplifier. The input terminal 802, the output terminal 804 and the reference potential terminal 806 may be three terminals which may be configured as contact pins/pads, providing an interface between the voltage regulating circuit 800 according to various embodiments and a surrounding circuitry, such as an PCB.

The voltage regulating circuit 800 according to various embodiments may be provided as an integrated circuit (IC). The voltage regulating circuit 800 according to various embodiments may be configured as a voltage regulating circuit with a high drop voltage. In that case, a charge pump for providing a control/driving signal for the control terminal of the control transistor 810 may be omitted. A charge pump may be provided if a low drop voltage is desired. The charge pump may, for example, then be active all the time or only in situations, in which the input voltage Vin is very low and hence a negligible drop voltage is desired.

In FIG. 8B a four pin embodiment 840 of the voltage regulating circuit according to various embodiments is shown. Due to its similarity to the voltage regulating circuit 800 shown in FIG. 8A, the same elements carry the same reference numbers and they will not be described again.

The difference between the voltage regulating circuit 800 shown in FIG. 8A and the voltage regulating circuit 814 shown in FIG. 8B is that the latter includes an additional supply voltage terminal 820 which is coupled to the first power supply terminal of the error amplifier 808 (instead of the input terminal 802 being coupled thereto). By means of the supply voltage terminal 820 a supply voltage Vs which may be independent of the input voltage Vin may be provided to the error amplifier 808. The supply voltage Vs may be sufficiently high such that a charge pump may not be needed in order to obtain a very low drop voltage of the pass element. In addition, the output voltage Vout sensed by the error amplifier 808 via its second input is divided by a voltage divider including a first resistor 816 and a second resistor 818 which are coupled in series between the output terminal 804 and the reference potential terminal 806.

Figure 9A:
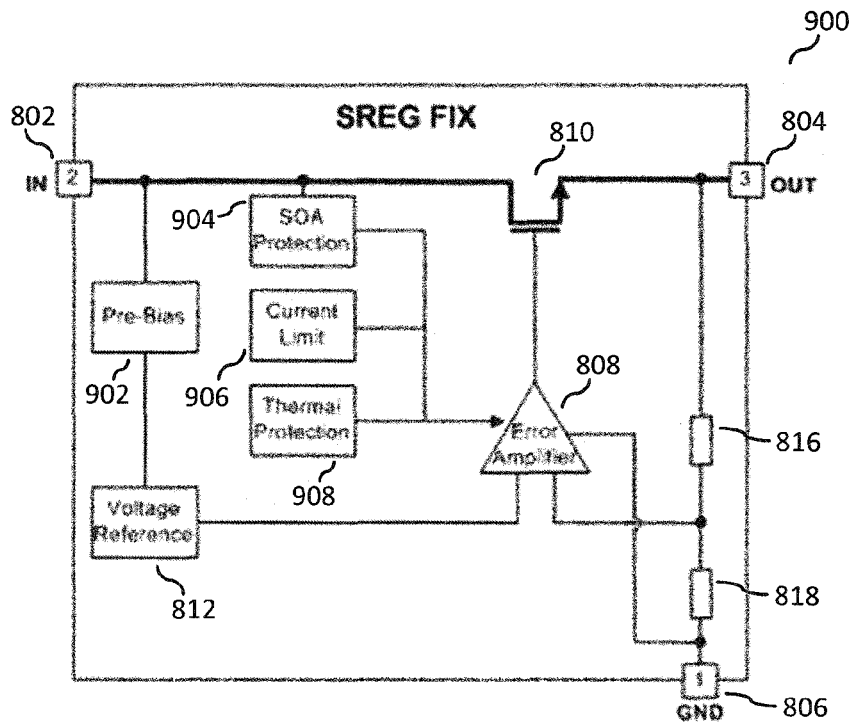
FIG. 9A and FIG. 9B show further exemplary implementations voltage regulating circuit according to various embodiments.

In FIG. 9A a further embodiment of the voltage regulating circuit 900 is shown. The voltage regulating circuit 900 according to various embodiments is based on the implementations thereof shown in FIG. 8A and in FIG. 8B. Therefore, the same elements carry the same reference numbers and they will not be described again.

The voltage regulating circuit 900 according to various embodiments shown in FIG. 9A may be provided as an integrated circuit having three contact terminals in analogy to the voltage regulating circuit 800 shown in FIG. 8A. In addition to the components/elements depicted in FIG. 8A, the voltage regulating circuit 900 according to various embodiments may further include a pre-bias a circuit 902 coupled between the input terminal 102 and the reference voltage generator 812. The pre-bias circuit 902 may be configured as a power supply for the reference voltage generating circuit 812 and block disturbances/ripple which may be present on the voltage applied to the input terminal 802 from reaching the reference voltage generating circuit 812. Further, an SOA (safe operating area) circuit 904 may be coupled between the input terminal 802 and the error amplifier 808. The SOA circuit 904 may be configured to ensure that the voltage regulating circuit 900 operates within a rated operating area. A current limiting circuit 906 and a thermal protection circuit 908 may be further provided and coupled to the error amplifier 808 in order to prevent a malfunction or damage of the voltage regulating circuit 900 according to various embodiments due to overcurrent or overheating, respectively.

Figure 9B:
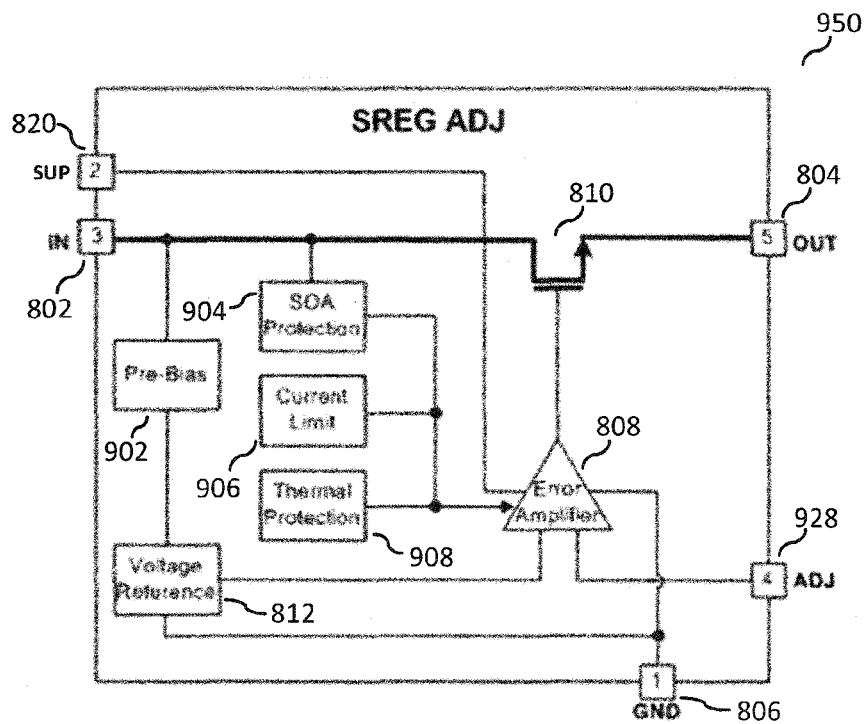

In FIG. 9B a yet further embodiment of the voltage regulating circuit 950 is shown. The voltage regulating circuit 950 according to various embodiments is very similar to the embodiment shown in FIG. 9A. Therefore the same elements carry the same reference numbers and they will not be described again. The voltage regulating circuit 950 includes two more contact terminals (which may be contact pads) than the embodiment shown in FIG. 9A. A fourth contact terminal may be provided which corresponds to the supply voltage terminal 820 configured to receive the supply voltage Vs, as shown in FIG. 8B, and is coupled to the error amplifier 808. A fifth contact terminal 928 may be provided and used for setting the regulated output voltage Vout by means of an external voltage divider (instead of an internal voltage divider including the first resistor 816 and the second resistor 818 in a series arrangement as shown in FIG. 9A). Further functional circuits providing functionalities such as enable, soft start and power good may be further implemented into the embodiments of the voltage regulating circuit shown in FIG. 9A and FIG. 9B. The enable functionality may be relevant for an efficient power management and it may relate to the possibility of switching off the voltage regulating circuit 950, which may have a very low current consumption in that state. The power good functionality may refer to the output voltage being monitored for undervoltage and/or overvoltage and a corresponding error message may be generated, e.g. by setting a digital error flag, in the case of a detection of any one of those error states.

Figure 10:
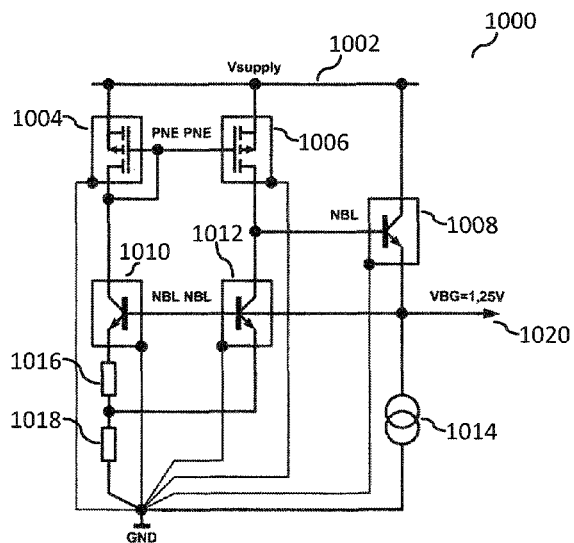
FIG. 10 shows an exemplary implementation of the bandgap reference voltage generator in accordance with various embodiments.

In FIG. 10 an exemplary implementation of the reference voltage generator 812 (reference voltage generating circuit) is shown. The exemplary reference voltage generator 1000 according to various embodiments shown in FIG. 10 is configured to provide a bandgap reference voltage, for example a bandgap reference voltage of 1.25V.

The reference voltage generating circuit 1000 according to various embodiments may include a first transistor 1004 and a second transistor 1006, wherein each of those transistors may be configured as an enhancement-type PMOS transistor. A first source/drain terminal of the first transistor 1004 and a first source/drain terminal of the second transistor 1006 are coupled to a supply terminal 1002. A second source/drain terminal of the first transistor 1004 is coupled to a first terminal of a third transistor 1010 which may be a collector terminal of an NPN bipolar transistor. A second source/drain terminal of the second transistor 1006 is coupled to a first terminal of a fourth transistor 1012 which may be a collector terminal of an NPN bipolar transistor. The gate terminal of the first transistor 1004 is coupled to the second source/drain terminal of the first transistor 1004 and to the gate terminal of the second transistor 1006. A second terminal of the third transistor 1010, for example an emitter terminal, may be coupled to a reference potential, for example the ground potential, via a series arrangement including a first resistor 1016 and a second resistor 1018. A node between the first resistor 1016 and the second resistor 1018 is coupled to a second terminal, for example an emitter terminal, of the fourth transistor 1012. A control terminal of the third transistor 1010, for example its base terminal, and a control terminal of the fourth transistor 1012, for example its base terminal, are both coupled to an output 1020 of the reference voltage generator 1000. A current source 1014 is coupled between the output 1020 of the reference voltage generator circuit 1000 and the reference potential terminal GND. A fifth transistor 1008, for example an NPN bipolar transistor, is coupled between the supply terminal 1002 and the output terminal 1020. The control terminal of the fifth transistor 1008, for example its base terminal, is coupled to the electrical path between the second transistor 1006 and the fourth transistor 1012.

The transistors provided in the reference voltage generating circuit 1000 according to various embodiments may be isolated transistors provided on an n-type substrate. An isolated NPN bipolar transistor was already presented in FIG. 7B. In an analogous manner, a MOS transistor may be provided in a portion of the n-type substrate (or in a section of the epitaxial layer provided on the n+ substrate) which is located within the p-type well. Each of the transistor symbols in FIG. 10 includes a rectangle surrounding the transistor symbol which represents the p-type well. As shown in FIG. 7B, the well 748 surrounding the base region, the emitter region and the collector region of the isolated NPN bipolar transistor includes a contacting electrode 749. Thus, the potential of the well region 748 may be freely chosen. The well region of each of the five transistors provided in the reference voltage generator 1000 may be coupled to the reference potential, for example the ground potential, in a star-shaped arrangement such that every transistor is screened/isolated from disturbances by the grounded well.

Figure 11:
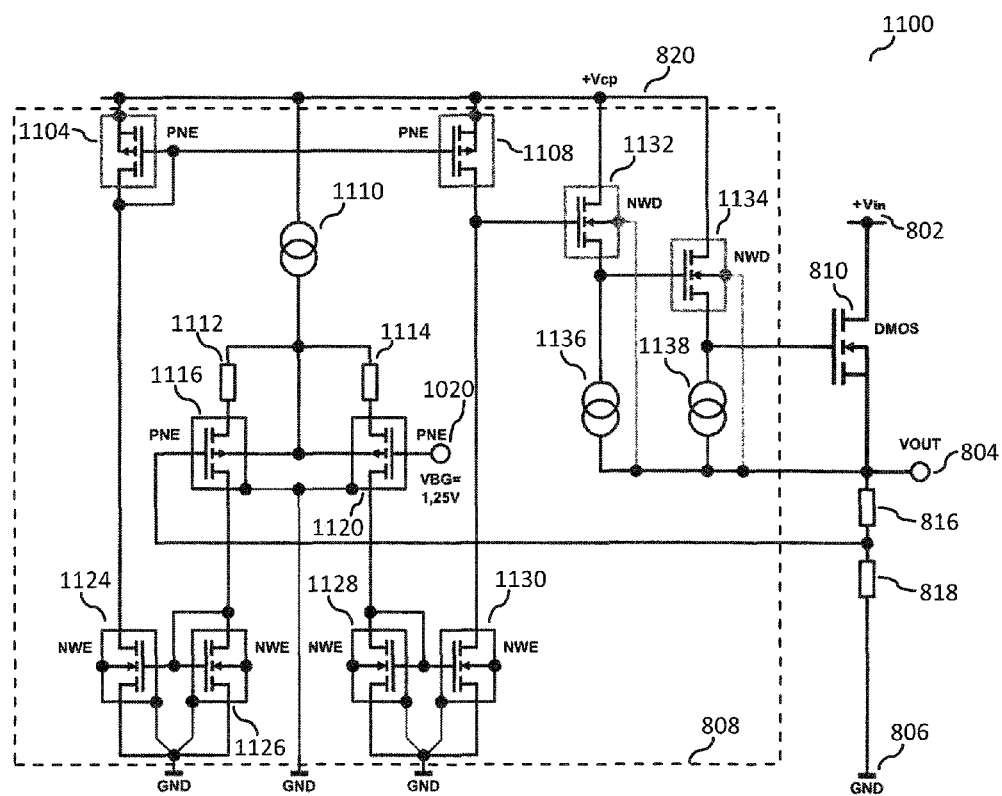
FIG. 11 shows an exemplary implementation of the error amplifier in accordance with various embodiments.

In FIG. 11 an exemplary implementation of the voltage regulating circuit 808 shown in FIG. 8B is presented. A possible implementation of the reference voltage generator 812 was already shown in FIG. 10 and for the sake of clarity that circuit is not shown in FIG. 11.

The voltage regulating circuit 1100 according to various embodiments includes, as already described with respect to FIG. 9B, the input terminal 802 which is coupled to a first source/drain terminal of the control transistor 810. The control transistor 810 may be configured as a vertical trench MOS transistor as shown in FIG. 7B or further as a vertical trench DMOS transistor. The second source/drain terminal of the control transistor 810 is coupled to the output terminal 804. The output voltage Vout is sensed via the resistive divider including the first resistor 816 and the second resistor 818 and provided to the regulating circuit 814, for example to the second input of the error amplifier 808.

The error amplifier 808 may include a first transistor 1104, for example an enhancement-type PMOS transistor. A first source/drain terminal of the first transistor 1104 may be coupled to the supply voltage terminal 820. A gate terminal of the first transistor 1104 may be coupled to a second source/drain terminal thereof and to a gate terminal of a second transistor 1108, for example an enrichment-type PMOS transistor. A first source/drain terminal of the second transistor 1108 may be coupled to the supply voltage terminal pad 820. A second source/drain terminal of the second transistor 1108 may be coupled to a first source/drain terminal of an eighth transistor 1130, for example an enhancement-type NMOS transistor, and to a gate terminal of the ninth transistor 1132, for example a depletion-type NMOS transistor. A second source/drain terminal of the eighth transistor 1130 may be coupled to the reference potential, for example the ground potential GND. A gate terminal of the eighth transistor 1130 may be coupled to a gate terminal of a seventh transistor 1128, for example an enhancement-type NMOS transistor, and to a first source/drain terminal thereof. The first source/drain terminal of the seventh transistor 1128 may be coupled to a second source/drain terminal of a fourth transistor 1120, for example an enhancement-type PMOS transistor. A second source/drain terminal of the seventh transistor 1128 may be coupled to the reference potential. A first source/drain terminal of the fourth transistor 1120 may be coupled to a third current source 1110 and to the reference potential via a fourth resistor 1114 and further to a first source/drain terminal of a third transistor 1116, for example an enhancement-type MOS transistor, via the fourth resistor 1114 and a third resistor 1112. The third current source 1110 may be further coupled to the supply voltage terminal pad 1102. A gate terminal of the fourth transistor 1120 may be coupled to the output terminal 1020 of the reference voltage generator 1000 shown in FIG. 10 such that the bandgap reference voltage VBG may be applied thereto. A gate terminal of the third transistor 1116 may be coupled to a node between the first resistor 816 and the second resistor 818 such that the output voltage Vout may be sensed. A second source/drain terminal of the third transistor 1116 may be coupled to a first source/drain terminal of a sixth transistor 1126, for example an enhancement-type NMOS transistor, to a gate terminal thereof and to a gate terminal of a fifth transistor 1124, for example an enhancement-type NMOS transistor. A second source/drain terminal of the sixth transistor 1126 and a second source/drain terminal of the fifth transistor 1124 may be coupled to the reference potential. A first source/drain terminal of the fifth transistor 1124 may be coupled to a second source/drain terminal of the first transistor 1104. A first source/drain terminal of the ninth transistor 1132 may be coupled to the supply voltage terminal pad 820. A second source/drain terminal of the ninth transistor 1132 may be coupled to a gate terminal of a tenth transistor 1134, for example a depletion-type NMOS transistor, and to the output 804 of the voltage regulating circuit 1100 via a first current source 1136. A first source/drain terminal of the tenth transistor 1134, for example a depletion-type NMOS transistor, may be coupled to the supply voltage terminal pad 1102, a second source/drain terminal of the 10th transistor 1134 may be coupled to the control region of the control transistor 810 and to the output of the voltage regulating circuit 1100 via a second current source 1138.

The transistors provided in the error amplifier circuit 808 shown in FIG. 11 according to various embodiments may be isolated transistors provided on an n-type substrate, just as the transistors provided in the reference voltage generator 1000 according to various embodiments shown in FIG. 10. Each of the transistor symbols in FIG. 11 (except for the control transistor 810) includes a rectangle surrounding the transistor symbol which represents the p-doped well of the corresponding transistor. The first transistor 1104 and the second transistor 1108 may be configured such that the well of each of the transistors is coupled to its first source/drain terminal and to its bulk/body region. The ninth transistor 1132 and the tenth transistor 1134 may be configured such that the well of each of the transistors, simultaneously fulfilling the role of a bulk/body of the corresponding transistor, may be coupled to a lower voltage than the voltage of the second drain/source terminal of the corresponding transistor. However, the well may be also coupled to the second source/drain region of the corresponding transistor. The third transistor 1116 and the fourth transistor 1120 may be configured such that the well of each of the transistors is coupled to the reference potential. The fifth transistor 1124, the sixth transistor 1126, the seventh transistor 1128 and the eighth transistor 1130 may be configured such that the well of each of the transistors together with the bulk/body region of each of the transistors is coupled to the reference potential.

The configuration of the wells of the transistors included in the error amplifier 808 according to various embodiments shown in FIG. 11 corresponds to one of very many possible configurations. The key feature of the n-type substrate technology which may be used for a design of the voltage regulating circuit according to various embodiments may be seen in the fact that the p-doped well of each of the isolated transistors may be individually coupled to a defined potential. As demonstrated in FIG. 10, the wells of the transistors may be all coupled to the reference potential, for example the ground potential, forming a star-shaped arrangement. Therefore, when the well is coupled to a certain potential, the well may provide a screening/isolating functionality such that the operation of the corresponding transistor may be more stable and/or resistant to disturbances, for example HF-disturbances.

In the following, configurations of the transistors used in the reference voltage generator 1000 according to various embodiments and used in the voltage regulating circuit 1100 according to various embodiments will be described in more detail in FIGS. 12A to 12D. Even though each of the transistors is depicted in a separate figure, the transistors shown in FIGS. 12A to 12D may, for example, all be provided in one IC on one substrate/wafer. Therefore, the transistors may be provided in/on the wafer including an n-type substrate 1202 on which an epitaxial layer 1204 is provided. On the back side of the substrate 1202 a drain electrode/contact 1201 may be provided. The drain electrode 1201 may be only used by the pass element, that is by the control transistor which may be configured as a vertical MOS transistor, for example. Each of the views presented in FIGS. 12A to 12D is a cross-sectional side view through the substrate/wafer. Common aspects occurring in the embodiments of the transistors and relying on the same structures will be only described once upon their first occurrence.

Figure 12A:
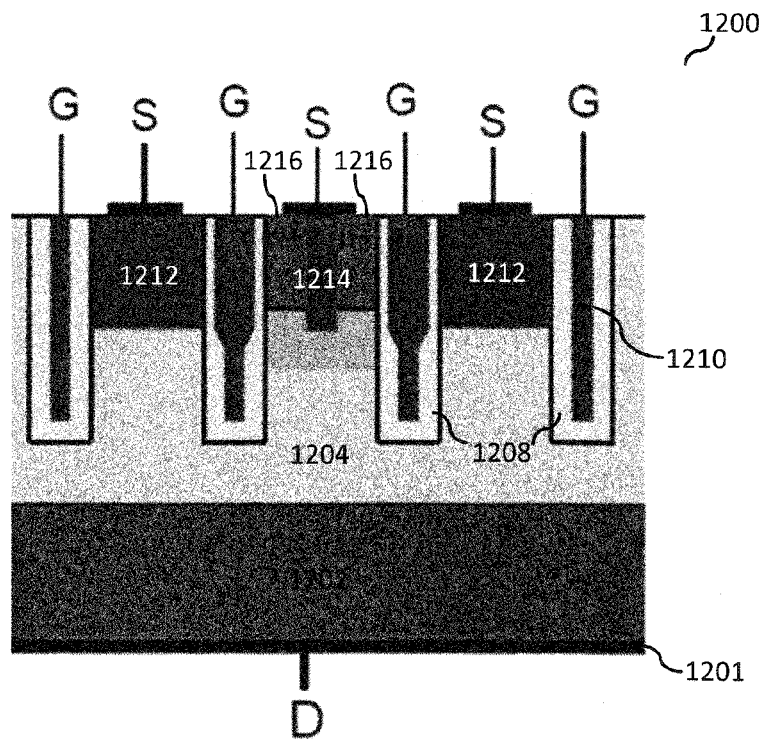
FIGS. 12A to 12D show configurations of isolated transistors for use in the reference voltage generator according to various embodiments and in the voltage regulating circuit according to various embodiments.

The vertical trench MOS transistor 1200 shown in FIG. 12A includes source electrodes S and gate electrodes G provided on the upper surface of the epitaxial layer 1204. Each of the gate electrodes G is coupled to a gate region 1210 extending downwards in a trench and being surrounded by an isolation material 1208, for example a dielectric material. When the vertical MOS transistor 1200 is in conducting state, which requires an appropriate voltage being applied to the gate electrodes G, a current flow from the source region 1216 through a channel formed in the body region 1214 towards the drain electrode 1201 is established. In other words, a current is only flowing through a center segment of the vertical MOS transistor 1200 including the source regions 1216 and the body region 1214. Blocking regions 1212 provided between the outermost source electrodes S and the epitaxial layer are provided between the first trench and the second trench and between the third trench and the fourth trench, counted from left to right. The blocking regions 1212 are provided in outer portions of the vertical trench MOS transistor 1200 in order to reduce leakage currents and may be p-doped with a doping concentration in the range of approximately $10^{17}$ cm$^{-3}$. As the current through the vertical trench MOS transistor 1200 flows in a vertical direction from the source regions 1216 arranged at the upper surface of the epitaxial layer 1204 towards the drain electrode D arranged on the back side of the substrate 1202, the substrate 1202 forms an integral part of the actual vertical MOS transistor 1200. In other words, the substrate 1202 may act as a drain region of the vertical trench MOS transistor 1200. Therefore, it may be seen the vertical MOS transistor 1200 being the pass element is at least partially formed in the substrate. On the other hand, the other transistors used in the reference voltage generator 1000 shown in FIG. 10 and in the voltage regulating circuit 1100 shown in FIG. 11 may be isolated transistors such that their currents in conducting state do not flow or trespass the substrate 1202. The essential structures of those transistors, i.e. source region or emitter region, gate region or base region and drain region or collector region, are provided in the epitaxial layer regions within the wells and are therefore provided on or above the substrate 1202. However, in alternative embodiments vertical transistors may be used in the reference voltage generator 1000 shown in FIG. 10 and the voltage regulating circuit 1100 shown in FIG. 11 instead of planar transistors.

Figure 12B:
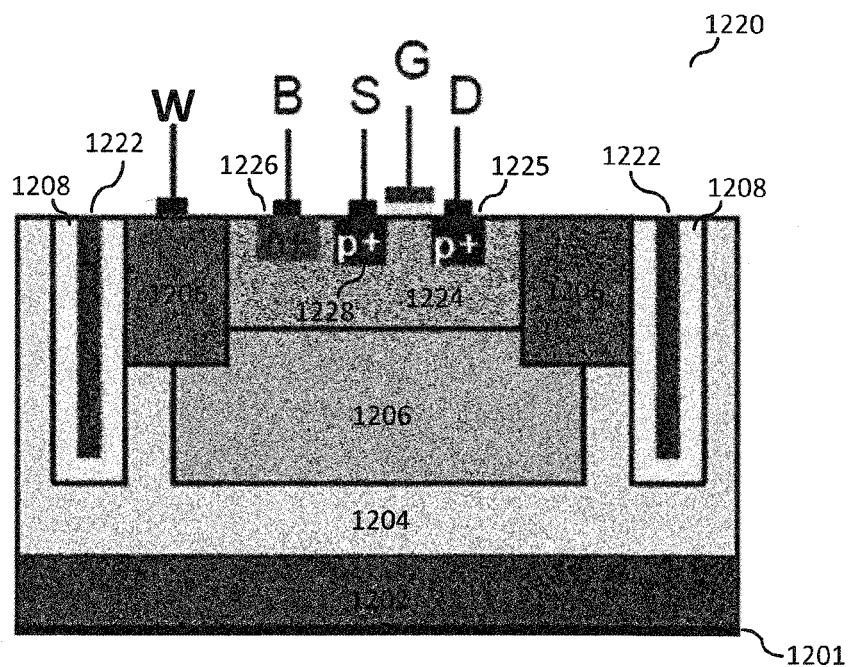

In FIG. 12B a cross-sectional view through an enhancement-type PMOS transistor 1220 is shown. The PMOS transistor 1220 includes a source electrode S coupled to a source region 1228 which may be p-doped, a drain electrode D coupled to a drain region 1225 which may be p-doped and a gate electrode G provided above a portion of the body between the source region 1228 and the drain region 1225. A body electrode B is coupled to the bulk/body 1224 of the PMOS transistor 1220 via an n-doped body region 1226. The bulk/body 1224 in which the PMOS transistor is formed is located within a well 1206 which may be p-doped. The subdivision of the well 1206 into three parts may merely reflect the circumstance of the part of the well 1206 located underneath the bulk/body 1224 of the PMOS transistor 1220 being manufactured in a different process than the two parts forming the walls of the well 1206. A well electrode W is coupled to the well 1206. Adjacent to the sides of the well 1206 trenches are provided which may include a conducting material 1222 such poly silicon surrounded by an insulating material 1208 such as a dielectric material.

The enhancement-type PMOS transistor 1220 may correspond to the first transistor 1004 and the second transistor 1006 provided in the voltage reference voltage generator 1000 shown in FIG. 10 and to the third transistor 1116 and the fourth transistor 1120 provided in the voltage regulating circuit 1100 shown in FIG. 11. To achieve the corresponding configuration the well electrode W may be connected to the bulk electrode B and the source electrode S.

Figure 12C:
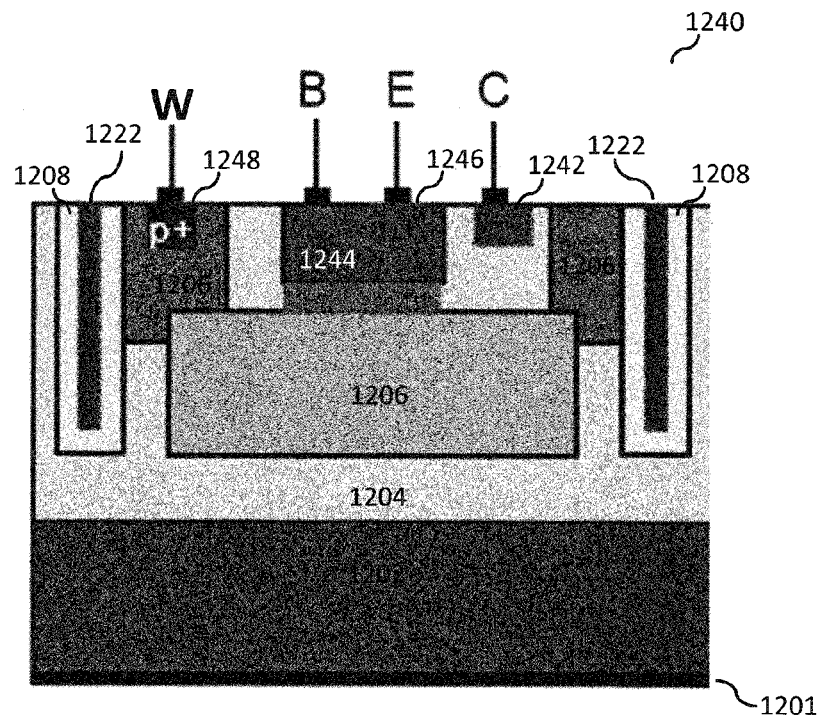

In FIG. 12C a cross-sectional view of a NPN bipolar transistor 1240 is shown. The NPN bipolar transistor 1240 includes a base electrode B coupled to a base region 1244 which may be p-doped, an emitter electrode E coupled to an emitter region 1246 which may be n-doped and may be arranged within the base region 1244, and a collector electrode C coupled to a collector region 1242 which may be n-doped. In analogy to the case of the isolated PMOS transistor 1220 shown in FIG. 12B the isolated NPN bipolar transistor is provided within the well 1206 which may be p-doped and which may include a well electrode W coupled thereto via a coupling region 1248 which may be p-doped. The contact region 1248 may provide a low ohmic contact between the well electrode W and the well 1206.

The NPN bipolar transistor 1240 shown in FIG. 12C may correspond to the third transistor 1010, the fourth transistor 1012 and the fifth transistor 1008 provided in the voltage reference voltage generator 1000 shown in FIG. 10. To achieve the corresponding configuration the well electrode W may be connected to the reference potential, for example the ground potential.

Figure 12D:
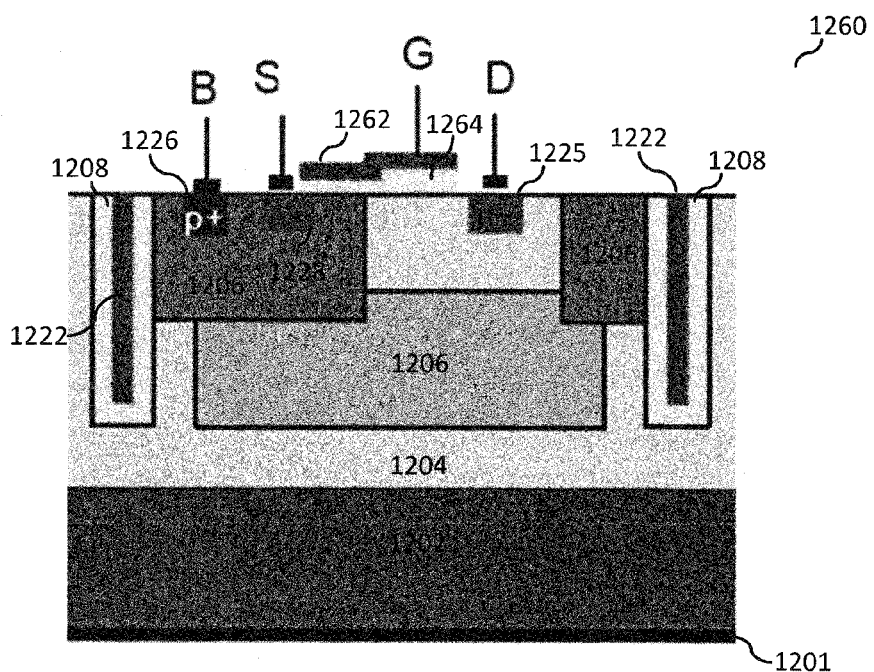

In FIG. 12D a cross-sectional view of a NMOS transistor 1260 is shown. The NMOS transistor 1240 includes a source electrode S coupled to a source region 1228 which may be n-doped, a drain electrode D coupled to a drain region 1225 which may be n-doped and a gate electrode G which may be coupled to a gate 1262. The gate 1262 may be arranged on an isolating layer 1264 provided on the surface of the epitaxial layer 1204 within the well 1206 and it may be isolated from the rest of the epitaxial layer 1204 by the p-doped well 1206. A body electrode B is provided coupled to a body region 1226 which may be p-doped and which is provided in a portion of the well 1206. In other words, in this exemplary embodiment a portion of the well 1206 simultaneously serves as a body region of the NMOS transistor 1260.

The NMOS transistor 1260 shown in FIG. 12D may be configured as an enhancement-type or a depletion-type transistor, depending on the kind of voltage applied to the gate electrode G and the kind of doping of the region between the source region 1228 and the drain region 1225. The NMOS transistor 1260 configured as an enhancement-type transistor may correspond to the fifth transistor 1124, to the sixth transistor 1126, to the seventh transistor 1128 and to the eighth transistor 1130 provided in the voltage regulating circuit 1100 shown in FIG. 11. To achieve the corresponding configuration the body electrode B which in this case also corresponds to the well electrode may be coupled to the reference potential, for example the ground potential. The NMOS transistor 1260 configured as a depletion-type transistor may correspond to the ninth transistor 1132 and to the tenth transistor 1134 provided in the voltage regulating circuit 1100 shown in FIG. 11. To achieve the corresponding configuration, the body electrode B which in this case corresponds to the well electrode may be coupled the electrical path between the first current source and the second current source and the output terminal pad 1140 of the voltage regulating circuit 1100.

Figure 13:
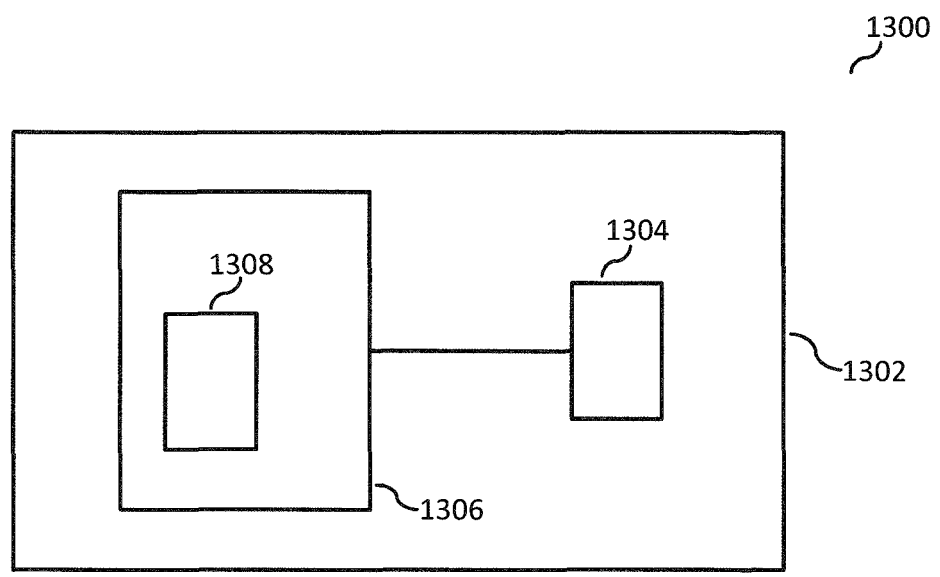
FIG. 13 shows a general implementation of the voltage regulating circuit according to various embodiments.

A general implementation of the voltage regulating circuit according to various embodiments is shown in FIG. 13. The voltage regulating circuit 1300 according to various embodiments may include a control transistor 1304 being at least partially formed in an n-type substrate 1302 and a regulating circuit 1306 including a regulating output coupled to a control region of the control transistor 1304, wherein the regulating 1306 circuit comprises at least one transistor 1308 which is formed at least one of on and in the n-type substrate 1302.

In accordance with various embodiments the voltage regulating circuit may include a control transistor at least partially formed in an n-type substrate and a regulating circuit including a regulating output coupled to a control region of the control transistor, wherein the regulating circuit may include at least one transistor which is formed at least one of on and in the n-type substrate.

According to further embodiments the voltage regulating circuit may further include an input terminal coupled to a first controlled terminal of the control transistor.

According to further embodiments the voltage regulating circuit may further include an output terminal coupled to a second controlled terminal of the control transistor.

According to further embodiments of the voltage regulating circuit the first controlled terminal of the control transistor may be provided over a first side of the n-type substrate.

According to further embodiments the voltage regulating circuit may further include a layer provided on the first side of the n-type substrate, wherein the first controlled terminal of the control transistor may be formed at a surface of the layer.

According to further embodiments of the voltage regulating circuit the layer may include an epitaxial layer.

According to further embodiments of the voltage regulating circuit the layer may be doped with at least one n-type dopant.

According to further embodiments of the voltage regulating circuit the doping concentration of the layer may be smaller than the doping concentration of the substrate.

According to further embodiments of the voltage regulating circuit the second controlled terminal of the control transistor may be provided at a second side of the n-type substrate, opposite the first side of the n-type substrate.

According to further embodiments of the voltage regulating circuit the n-type substrate may include the second controlled terminal.

According to further embodiments of the voltage regulating circuit the control transistor may be configured to permit a current flow between its controlled terminals which may be substantially perpendicular to a plane defined by the n-type substrate.

According to further embodiments of the voltage regulating circuit the control transistor may be configured as a vertical transistor.

According to further embodiments of the voltage regulating circuit the control transistor may be configured as a vertical field effect transistor.

According to further embodiments of the voltage regulating circuit the control transistor may be configured as a vertical metal-oxide-semiconductor field effect transistor.

According to further embodiments of the voltage regulating circuit the control transistor may be configured as a double-diffused metal-oxide-semiconductor field effect transistor.

According to further embodiments of the voltage regulating circuit the regulating circuit may be configured as a voltage controlled current source.

According to further embodiments of the voltage regulating circuit the regulating circuit may be configured as an operational transconductance amplifier.

According to further embodiments of the voltage regulating circuit the at least one transistor may include a first controlled terminal and a second controlled terminal, wherein the first controlled terminal thereof is formed at the surface of the layer.

According to further embodiments of the voltage regulating circuit the second controlled terminal of the at least one transistor may be formed at the surface of the layer.

According to further embodiments of the voltage regulating circuit the at least one transistor may be configured to permit a current flow between its controlled terminals which may be substantially parallel to a plane defined by the n-type substrate.

According to further embodiments the voltage regulating circuit may further include a well formed in the layer, wherein the at least one transistor may be arranged within the well.

According to further embodiments of the voltage regulating circuit the well may be doped with at least one p-type dopant.

According to further embodiments of the voltage regulating circuit the doping concentration of the well may be smaller than the doping concentration of the substrate.

According to further embodiments of the voltage regulating circuit the well may have a well terminal coupled thereto.

According to further embodiments of the voltage regulating circuit the well terminal may be coupled to a reference potential.

According to further embodiments of the voltage regulating circuit the well terminal may be coupled to that controlled terminal of the two controlled terminals of the at least one transistor which has a lower voltage potential.

According to further embodiments of the voltage regulating circuit the well terminal may be coupled to a potential which is lower than the potential at that controlled terminal which has a lower voltage potential of the two controlled terminals of the at least one transistor.

According to further embodiments of the voltage regulating circuit the layer may include a layer terminal which is coupled to one of the controlled terminals of the transistor and the well terminal may be coupled to the layer terminal.

According to further embodiments of the voltage regulating circuit the well may be configured to isolate the at least one transistor from the layer surrounding the well.

According to further embodiments of the voltage regulating circuit the at least one transistor may be configured as a planar field effect transistor.

According to further embodiments of the voltage regulating circuit the at least one transistor may be configured as a planar metal-oxide-semiconductor field effect transistor.

According to further embodiments of the voltage regulating circuit the at least one transistor may be configured as a planar bipolar transistor.

According to further embodiments of the voltage regulating circuit the at least one transistor may be configured as a vertical bipolar transistor.

According to further embodiments of the voltage regulating circuit the second controlled terminal of the at least one transistor may be provided at a second side of the n-type substrate, opposite the first side of the n-type substrate.

According to further embodiments of the voltage regulating circuit the second controlled terminal of the at least one transistor and the second controlled terminal of the control transistor may be provided at the same side of the n-type substrate.

According to further embodiments of the voltage regulating circuit the regulating circuit may include an input configured to receive a feedback signal derived from a voltage output at the output terminal.

According to further embodiments of the voltage regulating circuit the regulating circuit may be configured to compare the feedback signal to a reference signal and provide a regulating signal to the control region of the control transistor based on the outcome of the comparison.

According to further embodiments of the voltage regulating circuit the regulating circuit may further include a bandgap reference voltage circuit which is configured to derive the reference signal from a bandgap reference voltage.

According to further embodiments of the voltage regulating circuit the n-type substrate may include the second controlled terminal of the at least one transistor.

According to further embodiments of the voltage regulating circuit the at least one transistor may be configured to permit a current flow between its controlled terminals which is substantially perpendicular to a plane defined by the n-type substrate.

According to further embodiments of the voltage regulating circuit the control transistor may be configured as a vertical field effect transistor.

According to further embodiments of the voltage regulating circuit the control transistor may be configured as a vertical metal-oxide-semiconductor field effect transistor.

In accordance with further embodiments a voltage regulator is provided which may include a regulating switch at least partially formed in a substrate and a controller comprising at least one switch which may be formed at least one of on and in the substrate, wherein the substrate may include an n-type substrate.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A voltage regulating circuit comprising:
    a control transistor at least partially formed in an n-type substrate;
    a regulating circuit comprising a regulating output coupled to a control region of the control transistor, wherein the regulating circuit comprises at least one transistor which is formed at least one of on and in the n-type substrate;
    an input terminal coupled to a first controlled terminal of the control transistor;
    wherein the first controlled terminal of the control transistor is provided over a first side of the n-type substrate;
    an output terminal coupled to a second controlled terminal of the control transistor;
    a layer provided on the first side of the n-type substrate, wherein the first controlled terminal of the control transistor is formed at a surface of the layer, and
    wherein the layer comprises an epitaxial layer.

2. The circuit of claim 1,
wherein the layer is doped with at least one n-type dopant.
3. The circuit of claim 2,
wherein the doping concentration of the layer is smaller than the doping concentration of the substrate.
4. The circuit of claim 1,
wherein the second controlled terminal of the control transistor is provided at a second side of the n-type substrate, opposite the first side of the n-type substrate.
5. The circuit of claim 4,
wherein the n-type substrate comprises the second controlled terminal.
6. The circuit of claim 4,
wherein the control transistor is configured to permit a current flow between its controlled terminals which is substantially perpendicular to a plane defined by the n-type substrate.
7. The circuit of claim 1,
wherein the control transistor is configured as a vertical transistor.
8. The circuit of claim 1,
wherein the at least one transistor comprises a first controlled terminal and a second controlled terminal, wherein the first controlled terminal thereof is formed at the surface of the layer.
9. The circuit of claim 8,
wherein the second controlled terminal of the at least one transistor is formed at the surface of the layer.
10. The circuit of claim 8,
wherein the at least one transistor is configured to permit a current flow between its controlled terminals which is substantially parallel to a plane defined by the n-type substrate.
11. The circuit of claim 8, further comprising:
a well formed in the layer, wherein the at least one transistor is arranged within the well.
12. The circuit of claim 11,
wherein the well is doped with at least one p-type dopant.
13. The circuit of claim 12,
wherein the doping concentration of the well is smaller than the doping concentration of the substrate.
14. The circuit of claim 11,
wherein the well is coupled to a reference potential.
15. The circuit of claim 11,
wherein the well is configured to isolate the at least one transistor from the layer surrounding the well.
16. The circuit of claim 1,
wherein the at least one transistor is configured as a planar field effect transistor.
17. The circuit of claim 1,
wherein the regulating circuit comprises an input configured to receive a feedback signal derived from a voltage output at the output terminal.
18. The circuit of claim 17,
wherein the regulating circuit is configured to compare the feedback signal to a reference signal and provide a regulating signal to the control region of the control transistor based on the outcome of the comparison.
19. The circuit of claim 18,
wherein the regulating circuit further comprises a bandgap reference voltage circuit which is configured to derive the reference signal from a bandgap reference voltage.

* * * * *

UNITED STATES PATENT AND TRADEMARK OFFICE
CERTIFICATE OF CORRECTION

| | | |
|---|---|---|
| PATENT NO. | : 9,064,713 B2 | Page 1 of 1 |
| APPLICATION NO. | : 13/604653 | |
| DATED | : June 23, 2015 | |
| INVENTOR(S) | : Michael Lenz | |

It is certified that error appears in the above-identified patent and that said Letters Patent is hereby corrected as shown below:

On the title page item 75, please replace "Zomeding" with "Zorneding".

Signed and Sealed this
First Day of March, 2016

Michelle K. Lee
*Director of the United States Patent and Trademark Office*